March 27, 1956 A. P. EDELMAN ET AL 2,740,097

ELECTRICAL HINGE CONNECTOR FOR CIRCUIT BOARDS

Filed April 19, 1951

INVENTORS.
AARON P. EDELMAN.
MORRIS WEINBERG,
BY Nicholas T Volk
atty.

2,740,097

ELECTRICAL HINGE CONNECTOR FOR CIRCUIT BOARDS

Aaron P. Edelman, Van Nuys, and Morris Weinberg, Encino, Calif., assignors, by mesne assignments, to Hughes Aircraft Company, a corporation of Delaware Application April 19, 1951, Serial No. 221,874

3 Claims. (Cl. 339—17)

This invention relates to flexible electrical connectors and more particularly, to flexible electrical connectors for hingedly mechanically connecting two dielectric members supporting electrical circuitry while simultaneously providing electrical continuity betwen the electrical circuitry contained thereon.

Many electronic applications require that the size of the equipment utilized be reduced to a minimum, but yet retain sufficient accessibility for necessary servicing operations. In general, the two requirements of minimum size and ready accessibility are inconsistent, and considerable difficulty has been encountered in the past in attempting to obtain both characteristics simultaneously. For example, a theoretical minimum size of an electronic unit may be obtained by mounting all electronic circuit elements including tubes, resistances, condensers, lead wires, etc. in such a manner as to completely fill a volume with only a bare minimum of space remaining between adjacent elements. To service an electronic unit so constructed requires, in most instances, that interfering elements be removed to obtain access to the inner circuit portions. Removal, or disconnection of any circuit elements of a unit is extremely undesirable since the remaining circuitry would cease normal operations which considerably increases the difficulty of the servicing operation.

Maximum accessibility of electronic units for ready servicing, on the other hand, has been obtained by mounting the circuit elements in single layer fashion over an area rather than in a volume fashion so that each individual element lies in an exposed position. Servicing of a unit having such a mounting arrangement may be effected with considerable ease, as each element may be checked or tested without disturbing the remaining elements or the operation of the entire circuit. Such a mounting system, however, inherently fails to provide a maximum utilization of available space, and hence lacks the desired compactness.

This invention makes use of a combination volume and layer mounting arrangement for electric circuit elements which provides both an ultimate in compactness while also allowing access to the individual elements for servicing without interruption of the circuit's operation. This is accomplished by mounting the constituent elements in several single layers, and then hingedly joining these layers in such a way that the layers may be folded together in an accordion-like manner, so as to obtain minimum size of the overall unit, or unfolded to obtain maximum accessibility to the individual components on each layer. The layers comprise individual board members of dielectric material to which the circuit components are affixed. Adjacent members are joined by hinges in the form of resilient conductive spring elements which serve both to mechanically interconnect the boards and to electrically connect the electric components on the boards. Each resilient spring element thus serves to electrically connect one component on one board to another component on another board, and its mechanical resilience, added to the resilience of similar spring elements also serving to electrically connect other components on the two board members, constitutes a flexible and resilient mechanical coupling between the two boards. The boards when joined in this manner may be angularly separated to expose the electrical components on each layer so that the unit may be readily serviced without interrupting the operation of the included circuit, and then folded back in place to obtain a unit of minimum size. This invention, therefore, provides an interconnection of electrical circuitry which results in a unit of maximum compactness while retaining ready accessibility to all of its components for servicing operations.

It is the principal object of this invention to provide resilient hinge connections between two boards containing electronic circuitry which mechanically interconnect the boards and conductively interconnect the electronic circuitry on the two boards.

Another object of this invention is to provide a resilient hinge means for electrically connecting circuit components located on two boards while simultaneously mechanically interconnecting the two boards.

Another object of this invention is to provide a resilient mechanical connection between two dielectric boards having electrical components thereon so that the boards may be physically separated without interfering with the operation of the associated electronic circuitry.

Still another object of this invention is to provide a means of mounting complex electronic circuitry in an interconnected layer-like fashion whereby the layers may be folded in close proximity so as to obtain a minimum size of the circuitry, or may be unfolded so as to allow maximum accessibility to the circuitry for servicing thereof without interruption of its operation.

Still another object of this invention is to mount the circuitry of an electronic unit in an interconnected layer fashion so that the layers may be folded together to obtain minimum size of the unit or spread apart to be accesible for servicing.

The novel features which are believed to be characteristic of the invention, both as to its organization and method of operation, together with further objects and advantages thereof, will be better understood from the following description considered in connection with the accompanying drawings. It is to be expressly understood, however, that the drawings are for the purpose of illustration and description only, and are not intended as a definition of the limits of the invention.

Fig. 1 is a view of a portion of a printed electronic circuit;

Figs. 2*a*, 2*b* and 2*c* are cross-sectional views of a portion of this invention in three different positions;

Figure 1:
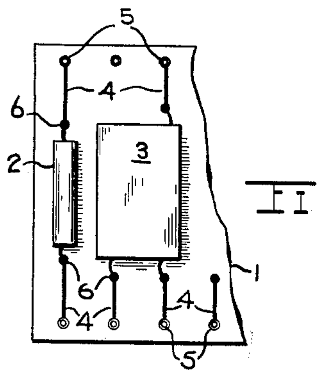

Fig. 1 illustrates a portion of a typical printed electronic circuit which may be electrically and mechanically joined by this invention to similar printed circuits. It comprises a board member 1 of dielectric material, containing a series of holes spaced along two of its edges, into which a series of metallic tubular eyelets 5, of conductive material, are inserted and secured. The function of eyelets 5 will become more apparent in the description accompanying Figs. 2*a*–2*c*. Various paths 4, of conductive material, extend inwardly from these eyelets and terminate in puddle-like junctions 6. These conductive paths 4 may be placed on board 1 by any printed circuit technique, or may, instead, consist of conventional lead wires extending between the junctions 6 and eyelets 5. A pair of circuit components are illustrated by way of example on board 1, and disclose typical electronic circuit components in association with the printed circuit. The lead wires of circuit components 2 and 3 are attached to various junctions 6 to provide both physical supports for the respective components as well as conductive connections to various conductive paths.

Figure 2A:
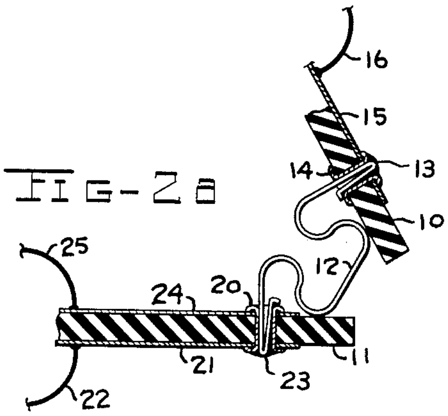

Fig. 2*a* discloses a portion of two dielectric members 10 and 11, each indicative of board member 1 in Fig. 1, and each containing electronic components (not shown) electrically and hingedly mechanically joined by a resilient spring element according to this invention. Member 10 contains a conductive path 15, leading along one of its surfaces between an eyelet 14 and a lead wire 16 of an electrical circuit component (not shown) lying on its surface. Member 11 contains two conductive paths 21 and 24, extending along its two surfaces. One conductive path 21 extends between an eyelet 20 and a lead wire 22 of an electrical component (not shown) lying on one surface, while the other conductive path 24 extends along the other side of member 11 between eyelet 20 and a lead wire 25 of another electrical component (not shown) lying on its other surface. A spring 12, more fully described and illustrated in connection with Fig. 4, has two bent ends inserted and soldered as indicated at 13 and 23 into the eyelets 14 and 20, respectively. This spring 12, preferably constructed of beryllium copper, serves to electrically connect the lead wires 16, 22 and 25 together and, by its mechanical resilience, serves further to provide a flexible mechanical hinge coupling between the two boards 10 and 11.

Figure 4:
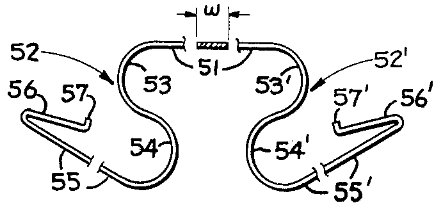
Fig. 4 is a view of an element of this invention.

The position assumed by the boards 10 and 11 in Fig. 2*a* is effected by the unsprung or untensioned position of spring 12, and this position is automatically assumed whenever boards 10 and 11 are not subjected to any positioning forces. The shape of spring 12, under such conditions, is identical to its original shape as illustrated in Fig. 4.

Figure 2B:
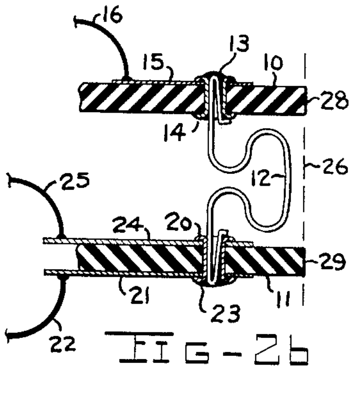

Fig. 2*b* illustrates the identical structure disclosed in Fig. 2*a*, except that the members 10 and 11, in this example, are maintained in a parallel relationship with one another. Such a parallel relationship is effected in the usual mounting arrangement of such boards as illustrated in the example disclosed in Fig. 3. By maintaining boards 10 and 11 parallel, the overall unit occupies a minimum of space as the volume enclosed by them is effectively filled by the electrical components lying on the upper surface of board 11. The eyelets must be placed at a sufficient distance from the edges 28 and 29 of boards 10 and 11, respectively, so that no portion of spring 12 will project past line 26, formed by edges 28 and 29. This will prevent spring 12 from making accidental electrical contact with any conductive bodies nearby.

Figure 2C:
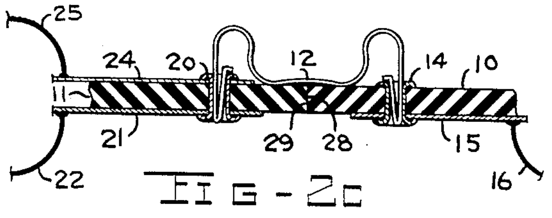

Fig. 2*c* illustrates the identical structure of Fig. 2*a* when the two boards 10 and 11 are angularly separated until both occupy the same plane. In this position, the two edges 28 and 29 of boards 10 and 11, respectively, come to rest against one another to form, with spring 12, a temporary step position against further separation. When the boards occupy this position, their circuit components are completely exposed, but still electrically operable, thereby rendering their checking and servicing effortless. The two bent ends of spring 12 are illustrated in this example, Fig. 2*c*, as being inserted into eyelets 14 and 20 without the subsequent soldering. Spring 12 in this embodiment still serves as a mechanical hinge connection between members 10 and 11, and as an electrical connection betwen conductive paths 15, 21 and 24, but adds flexibility to the unit by being removable. This additional flexibility might be desirable in some circuit applications by permitting complete separation of adjacent board members if desired.

The embodiments illustrated in Figs. 2*a*–2*c* disclose metallic eyelets serving as circuit terminations for the various conductive paths. However, the eyelets may be omitted and the bent ends of spring 12 secured through the holes to the conductive paths directly. The provision of these eyelets is preferred, due to the greater mechanical strength obtained thereby for the unit.

Figure 3:
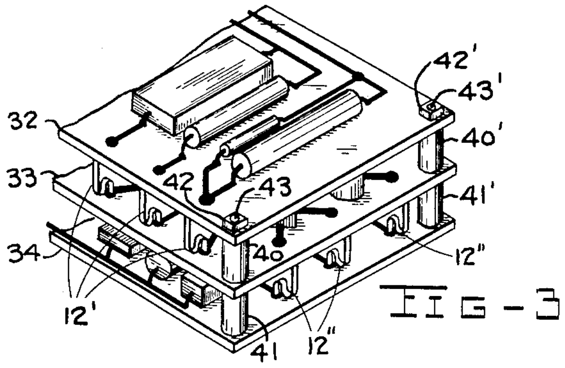
Fig. 3 is a perspective view of a portion of an electronic circuit utilizing this invention.

Fig. 3 illustrates, as an example, a portion of a complete electronic unit assembled and connected according to this invention. The unit comprises three board members 32, 33 and 34, each containing electrical components whose lead wires are soldered to the conductive paths in the manner shown for board 1 of Fig. 1. The electrical components on board 32 are electrically connected to various electrical components on board 33, as determined by the circuitry involved, by a plurality of resilient springs 12′, each similar to spring 12 of Figs. 2*a*–2*c*. Electrical connections between electrical components on boards 33 and 34 are accomplished by a plurality of springs 12″, also similar to spring 12 of Figs. 2*a*–2*c*. The three board members 32, 33 and 34 are maintained relative to each other by spacer elements positioned and secured at each corner. Spacer element 40 is positioned between one corner of boards 32 and 33 and another spacer element 41 is positioned between the corresponding corner of boards 33 and 34. Spacer elements 40 and 41 are secured in position by a nut 42 and a bolt 43 to provide thereby a mounting for this corner of the unit. The other corner illustrated is positioned by spacer element 40′ between boards 32 and 33 and spacer element 41′ between boards 33 and 34, and secured by bolt 43′ passing through the boards and spacer elements and nut 42′. The overall unit secured at all corners in this manner is thereby provided with a compact and rigid mounting for all of its constituent layers of electronic circuitry.

The unit, as illustrated in Fig. 3 in its mounted position, is in its most compact form and provides, upon proper choice and placement of the electronic circuit components on the various boards, a maximum utilization of available space. The unit in its mounted position would be extremely difficult to service due to the inaccessibility of its innermost components. However, the unit may be readily serviced by removing the nuts, bolts and spacer elements used to secure adjacent boards and angularly separating the boards along the axes formed by the rows of spring conductors. Thus, board 32 may be angularly raised upward toward the left with the series of springs 12′ forming a resilient axis for the angular displacement. When this is done, access may be had to the components between boards 32 and 33 formerly blocked when the board members were in spaced parallel relationship as was the case for the closed position of the unit. Board member 34 may also be separated from board 33 by lowering it to the right along an axis formed by springs 12″ thereby exposing the components between these respective boards for servicing. As will be noted, neither of these separations will interrupt the operation of the circuitry contained on the three boards, as electrical conductivity therebetween is continuously maintained by the conductive spring elements 12′ and 12″.

Fig. 4 discloses a single resilient spring conductor 12, as found in Figs. 2*a*—2*c* and Fig. 3, constructed from a strip of material having both resilience and conductivity. Beryllium copper has been found to be one especially suitable metal due to its relatively high conductivity, high fatigue strength and high elastic limit. Spring conductor 12 is symmetrical in shape and its straight middle section 51, shown broken so as to indicate its width *w*, blends into an S-shaped portion 52 on one side of section 51 and into a reversed S-shaped portion 52′ on the other side of middle section 51. S-shaped portion 52 consists of a convex curved portion 53 blending smoothly into a concave curved portion 54, which, in turn, extends into a straight portion 55. Straight portion 55 is abruptly bent back on itself to form a hooked portion 56 adapted to fit inside a conductor termination, as for example, the eyelets illustrated in Figs. 2*a*–2*c*. The end of the hooked portion 56 terminates in an angular projection 57 serving to position the hooked portion 56 within a conductor termination. The remaining portion of spring conductor 12, to the right of the straight portion 51, includes a reversed S-shaped portion 52', a straight portion 55', a bent end 56', and a right angle projection 57'.

Spring conductor 12, as illustrated in Fig. 4, is in its untensioned or unsprung position. When utilized to connect two circuit supporting members together, this unsprung position of the spring serves to position the members at an angle determined by the relative angle between the straight portions 55 and 55', respectively, of its two sides as is illustrated by the relative angular positions of boards 10 and 11 in Fig. 2*a*. The provision of this angular separation between straight portions 55 and 55' allows an automatic separation between adjacent boards whenever the spacing elements, as illustrated in Fig. 3, are removed. This angular separation exposes the inner circuitry, thereby allowing servicing to be made thereon without undue difficulty. If greater separation is desired, the boards may be manually separated even further, and separation of the type illustrated in Fig. 2*c* obtained.

The particular shape of spring 12 also possesses an advantage in allowing the conductor termination, illustrated as eyelets 14 and 20 as in Fig. 2*b*, to be located extremely close to the edges 28 and 29, respectively, of boards 10 and 11 without having its middle portion 51 project past line 26 formed by these two edges. This feature allows the area provided by board members 10 and 11 to be more efficiently utilized in containing circuit components. Spring 12 also is of such shape as to provide a relatively long bending length and this feature is accentuated by having the ends 56 and 56' bent toward middle portion 51. The relatively long bending length permits easier separation of the boards and reduces the strains developed in the individual spring elements thereby increasing the life of the overall unit.

It is also apparent to those skilled in the art that many variations are possible for the shape of spring 12. Although the shape illustrated is preferred for reasons cited previously, it may be modified somewhat without departing from the scope of the invention as long as it serves to provide both a stable, flexible mechanical hinge coupling between any two component carrying members, and an electrical coupling between conductive paths on the members.

What is claimed as new is:

1. A device for interconnecting first and second electronic circuit components, said device comprising: first and second dielectric members for supporting said first and second circuit components, respectively; a first electrically conductive path on said first member connectable to said first circuit component; a second electrically conductive path on said second member connectable to said second circuit component; a first tubular metallic eyelet in said first member connected to said first path; a second tubular metallic eyelet in said second member connected to said second path; and electrically conductive resilient hinge means providing an electrical connection between said paths and a mechanical hinge connection between said members, said hinge means comprising a flat spring including a longitudinally extending straight section, an S-shaped section having first and second ends, a reversed S-shaped section having first and second ends, the first ends of said S-shaped sections being integral with opposite ends, respectively, of said straight section, said S-shaped sections extending laterally of said straight sections in one direction, the second ends of said S-shaped sections comprising wedge-shaped portions, respectively, said wedge-shaped portions being secured within said first and second eyelets, respectively.

2. A device for interconnecting first and second pluralities of electronic circuit components; said device comprising first and second dielectric members for supporting the respective pluralities of circuit components, each of said members extending substantially in a single plane, and said first dielectric member normally being disposed in a spaced relation parallel and adjacent to said second dielectric member; electrically conductive paths on said first member connectable to the respective circuit components of said first plurality; electrically conductive paths on said second member connectable to the respective circuit components of said second plurality; terminals in said first member connected to the respective paths and located at preselected positions thereon; terminals in said second member connected to the respective paths and located at preselected positions thereon; and springs each formed of a ribbon of conductive material, said springs each having a substantially straight middle section, first and second ends bent with respect to the spring to form wedge-shaped ends, and different loop portions connecting the ends of the middle section separately to the different wedge-shaped ends, said springs electrically connecting terminals in said first member with terminals in said second member, mechanically connecting said dielectric members so as to aid in maintaining said first dielectric member in a spaced relation parallel and adjacent to said second dielectric member, and permitting said first dielectric member to be reoriented in the plane of said second dielectric member thereby making said circuit components readily accessible.

3. A flat spring for connecting a terminal mounted on one dielectric member to a terminal mounted on another dielectric member, the dielectric members being normally disposed in a spaced relation parallel and adjacent to each other, and said terminals comprising metallic eyelets adapted for connection to electronic circuit components supported by the respective dielectric members, said spring including a longitudinally extending straight section, an S-shaped section having first and second ends, a reverse S-shaped section having first and second ends, the first ends of said S-shaped sections being integral with opposite ends, respectively, of said straight section, said S-shaped sections extending laterally of said straight sections in one direction, the second ends of said S-shaped sections comprising wedge-shaped portions, respectively, the respective wedge-shaped portions being adapted for insertion into respective eyelets, so as to provide a mechanical and electrical connection between the eyelets whereby one of the dielectric members may be reoriented in the plane of the other dielectric member to expose the electronic circuit components thereon while maintaining the connection provided by said spring.

References Cited in the file of this patent

UNITED STATES PATENTS

| | | |
|---|---|---|
| 352,596 | Wilson | Nov. 16, 1886 |
| 1,587,120 | Haddock | June 1, 1926 |
| 1,637,864 | Kolster | Aug. 2, 1927 |
| 1,647,474 | Seymour | Nov. 1, 1927 |
| 1,790,101 | Kohloff | Jan. 27, 1931 |
| 1,910,022 | Legg | May 23, 1933 |
| 2,066,876 | Carpenter | Jan. 5, 1937 |
| 2,470,618 | Holden | May 17, 1949 |
| 2,474,988 | Sargrove | July 5, 1949 |
| 2,631,184 | Sampson | Mar. 10, 1953 |

FOREIGN PATENTS

| | | |
|---|---|---|
| 357,171 | Great Britain | Sept. 10, 1931 |
| 620,411 | Great Britain | Mar. 24, 1949 |